(12) United States Patent
Clavier

(10) Patent No.: US 8,137,117 B2
(45) Date of Patent: Mar. 20, 2012

(54) ELECTRICAL SUPPLY DEVICE FOR A DISCHARGE LAMP COMPRISING BALLAST SHIELDING

(75) Inventor: Philippe Clavier, Bobigny (FR)

(73) Assignee: Valeo Vision, Bobigny (FR)

( * ) Notice: Subject to any disclaimer, the term of this patent is extended or adjusted under 35 U.S.C. 154(b) by 800 days.

(21) Appl. No.: 12/252,486

(22) Filed: Oct. 16, 2008

(65) Prior Publication Data

US 2009/0103324 A1 Apr. 23, 2009

(30) Foreign Application Priority Data

Oct. 19, 2007 (FR) ...................................... 07 07349

(51) Int. Cl.
*H01R 4/66* (2006.01)
(52) U.S. Cl. ......................................................... 439/98
(58) Field of Classification Search .................. 362/459, 362/512, 519, 538, 539; 439/98
See application file for complete search history.

(56) References Cited

U.S. PATENT DOCUMENTS

| | | | | |
|---|---|---|---|---|
| 5,343,370 A * | 8/1994 | Ohashi et al. | ................ | 362/459 |
| 5,584,559 A * | 12/1996 | Toda | ................ | 362/539 |
| 5,607,228 A * | 3/1997 | Ozaki et al. | ................ | 362/263 |
| 5,879,073 A * | 3/1999 | Hori et al. | ................ | 362/344 |
| 5,895,113 A * | 4/1999 | Ozaki et al. | ................ | 362/546 |
| 6,043,614 A * | 3/2000 | Tessnow et al. | ................ | 315/291 |
| 6,161,951 A * | 12/2000 | Yoneyama et al. | ................ | 362/516 |
| 6,176,604 B1 * | 1/2001 | Dubrovin et al. | ................ | 362/539 |
| 6,243,018 B1 * | 6/2001 | Saito et al. | ................ | 340/650 |
| 6,309,089 B1 * | 10/2001 | Yoneyama et al. | ................ | 362/263 |
| 6,325,529 B1 * | 12/2001 | Ito | ................ | 362/539 |
| 6,390,657 B1 * | 5/2002 | Billot | ................ | 362/519 |
| 6,478,459 B1 * | 11/2002 | Ui | ................ | 362/512 |
| 6,540,385 B2 * | 4/2003 | Ikeda et al. | ................ | 362/512 |
| 6,867,673 B2 * | 3/2005 | Minami et al. | ................ | 336/107 |
| 6,916,204 B2 * | 7/2005 | Duarte et al. | ................ | 439/607.2 |
| 6,967,288 B2 * | 11/2005 | Ohsawa et al. | ................ | 174/104 |
| 7,172,316 B2 * | 2/2007 | Duarte et al. | ................ | 362/265 |
| 7,211,737 B2 * | 5/2007 | Minami et al. | ................ | 174/261 |
| 7,222,990 B2 * | 5/2007 | Duarte et al. | ................ | 362/265 |
| 7,993,044 B2 * | 8/2011 | Yamamoto | ................ | 362/519 |
| 2002/0148641 A1 * | 10/2002 | Minami et al. | ................ | 174/260 |
| 2002/0155738 A1 | 10/2002 | Ohsawa et al. | | |
| 2002/0171527 A1 * | 11/2002 | Minami et al. | ................ | 336/182 |
| 2008/0123345 A1 * | 5/2008 | Hamada et al. | ................ | 362/310 |
| 2009/0091908 A1 * | 4/2009 | Clavier et al. | ................ | 361/818 |
| 2010/0270929 A1 * | 10/2010 | Frohlich et al. | ................ | 315/82 |

FOREIGN PATENT DOCUMENTS

| | | |
|---|---|---|
| FR | 727040 A | 6/1932 |
| FR | 2700914 A1 | 7/1994 |
| JP | 2000164379 A | 6/2000 |
| JP | 2000173311 A | 6/2000 |

* cited by examiner

*Primary Examiner* — Tulsidas C Patel
*Assistant Examiner* — Vladimir Imas
(74) *Attorney, Agent, or Firm* — Jacox, Meckstroth & Jenkins

(57) ABSTRACT

An electrical supply device for a discharge lamp of a motor vehicle headlight that comprises: an electronic module for converting source electric current into supply electric current for the discharge lamp; a housing that encloses the electronic module and is produced from an electrically conductive material so as to form electromagnetic shielding; an electrical connection harness that is intended to electrically connect the electronic conversion module with the discharge lamp; an envelope produced from an electrically conductive material that surrounds the connection harness so as to form electromagnetic shielding; the housing and envelope being electrically connected to a common reference electrical potential (−); wherein the housing and the envelope are connected in parallel to the common reference electrical potential (−).

14 Claims, 3 Drawing Sheets

ELECTRICAL SUPPLY DEVICE FOR A DISCHARGE LAMP COMPRISING BALLAST SHIELDING

CROSS-REFERENCE TO RELATED APPLICATIONS

This application claims priority to French Application No. 0707349 filed Oct. 19, 2007, which application is incorporated herein by reference and made a part hereof.

BACKGROUND OF THE INVENTION

1. Field of the Invention

The invention concerns a device supplying a discharge lamp of a motor vehicle headlight.

The invention concerns more particularly an electrical supply device for a discharge lamp of a motor vehicle headlight that comprises:

an electric current source;

an electronic module for converting source electric current into supply electric current for the discharge lamp;

a housing that encloses the electronic module and is produced from/comprises an electrically conductive material so as to form electromagnetic shielding, in particular for attenuating the intensity of electromagnetic radiation emitted by the electronic module;

an electrical connection harness that is intended to electrically connect the electronic conversion module with the discharge lamp;

an envelope produced from/comprising an electrically conductive material that surrounds the connection harness so as to form electromagnetic shielding, in particular in order to attenuate the intensity of electromagnetic radiation emitted by the connection harness;

the housing and envelope being electrically connected to a common reference electrical potential.

2. Description of the Related Art

In the automobile industry, use is being made more and more of headlights equipped with discharge lamps, such as xenon lamps, in particular for their light yield and for their longevity.

This type of lamp requires a high-voltage AC electric current supply. In order to control the supply of electric current to the lamp, the headlight comprises an electrical supply device that is equipped with an electronic conversion module, normally referred to as "ballast", which supplies, from a battery voltage of the motor vehicle, high alternating voltages that are adapted to the type of discharge lamp used.

Discharge lamps may emit a large quantity of electromagnetic radiation, the effect of which is undesirable both with regard to the security of operation of the other electronic circuits of the vehicle and on the radio environment in which the vehicle is travelling.

To remedy this drawback, it is known how to take several measures referred to as "EMC", an acronym meaning "electromagnetic compatibility", separately or in combination according to circumstances, when the electrical supply device of the discharge lamp of the headlight is designed.

According to a first measure, it is known that the electromagnetic radiation is mainly emitted by the connectors, by the connection harness, the length of which may in some cases be high, and by certain electronic equipment such as the ballast. This first measure for reducing the electromagnetic radiation emissions consist, as is known, of executing a shielding of the supply harness to the electric lamp and the ballast as well as, where necessary, its connectors.

According to a second measure, the shielding of the lamp, of the ballast and of the supply harness or harnesses must be connected to a common reference electrical potential so that the various shieldings cannot vary in voltage during use and thus change into parasitic radiating structures.

The problem at the basis of the invention consists of ensuring that the shielding of the harness connecting the ballast to the discharge lamp is correctly connected to the reference potential so as to comply with the constraints relating to the electromagnetic standards.

It is known how to electrically connect the reference potential to the housing of the ballast and then to connect the shielding of the connection harness in series with the shielding of the ballast.

However, it was found that, in some configurations, such an interconnection did not make it possible to attenuate the parasitic electromagnetic radiation in a satisfactory manner.

SUMMARY OF THE INVENTION

To resolve this problem in particular, the invention proposes an electrical supply device of the type described above, the housing and envelope being connected in parallel to the common reference electrical potential.

According to other characteristics of the invention:

the envelope is connect to the common electrical potential by means of a contact element produced from an electrically conductive material having better electrical conductivity than the material used for producing the housing;

the contact element is produced from a material containing copper;

the housing comprises first connection means in which a first reciprocal connector electrically connected to the reference potential in intended to come to be engaged mechanically in a connected position, and the housing comprises second connection means in which a second reciprocal connector of the connection harness is intended to come to be engaged mechanically in a connected position, the second reciprocal connector being surrounded by the shielding envelope of the connection harness, the first connection means being arranged adjacent to the second connection means, and the contact element being arranged so as to electrically connect the common reference potential to the envelope when the first and second reciprocal connectors simultaneously occupy/are in their connected position;

the first and second connection means comprise a common mechanical connection block that is arranged in an opening in the housing, the contact element being carried by the connection block;

the connection block comprises a common partition that separates the first connection means from the second connection means, the contact element being formed by a link that straddles (crosses over) the common partition;

the connection block is surrounded by electromagnetic shielding that is produced in one piece with the contact element so as to prevent leakages of electromagnetic radiation through the opening in the housing;

the first connection means comprise an electrical connection with at least two connection branches of the electronic conversion module, electrically connected to each other, the first reciprocal connector electrically connected to the reference potential being intended to come to be engaged mechanically in a position connected to one of these branches, and the contact element being intended to engage mechanically and in electrical contact with the other connection branch; preferentially, the electrical connection is an electrical track of a printed circuit card of the electronic conversion module and is in the form of a fork, each branch of the fork constituting a connection branch of the electronic conversion module;

the connection block comprises a common partition that separates the first connection means from the second connection means, the contact element passing through the common partition;

the contact element is carried by one of the first or second reciprocal connectors.

Other characteristics and advantages will emerge from a reading of the following detailed description, for an understanding of which reference will be made to the accompanying drawings, among which:

BRIEF DESCRIPTION OF THE ACCOMPANYING DRAWINGS

Figure 6:
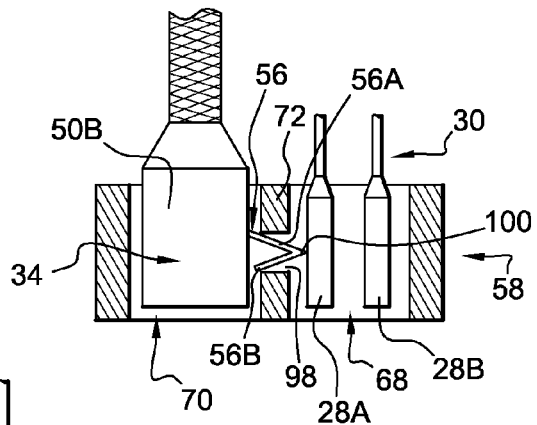
Figure 7:
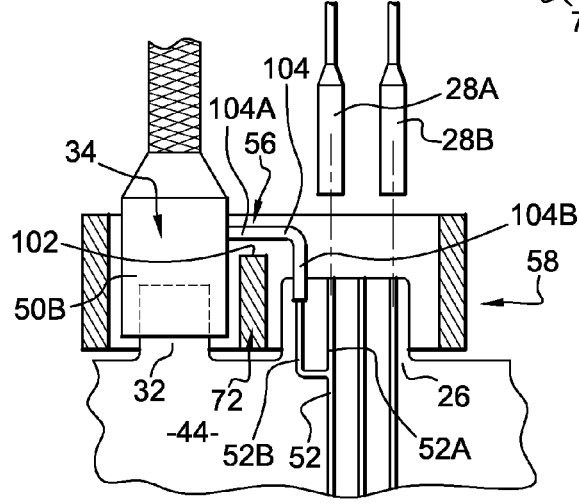

FIG. 6 is a view in horizontal section that depicts the mechanical connection unit that is produced according to a second embodiment of the invention and in which the two reciprocal connectors of the connection and supply harness are in the connected position; and FIG. 7 is a view in horizontal section that depicts a fourth embodiment of the invention in which the mechanical connection block is arranged on the printed circuit card.

DETAILED DESCRIPTION OF THE PREFERRED EMBODIMENTS

In the following description, longitudinal orientations directed from rear to front, vertical directed from bottom to top and transverse directed from left to right, which are indicated by the trihedron "L,V,T" in FIG. 3, will be adopted non-limitatively.

Hereinafter, elements having identical, analogous or similar functions will be indicated by the same reference numbers.

Figure 1:
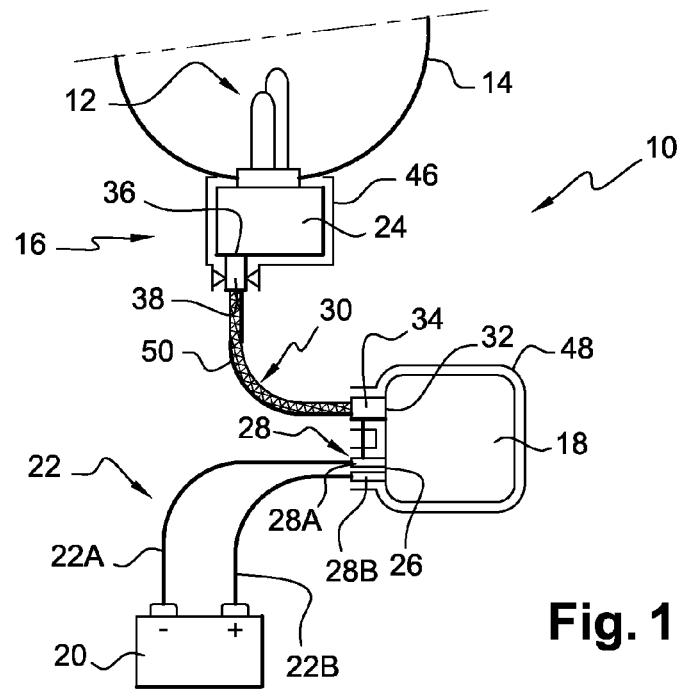
FIG. 1 is a schematic view that shows a motor vehicle headlight comprising a discharge lamp supplied by a supply device produced according to the teachings of the invention.

FIG. 1 depicts a motor vehicle headlight 10 that comprises a discharge lamp 12 arranged in a reflector 14. The discharge lamp 12 is here a bulb filled with a gas such as xenon at a high pressure, metal salts and halides in the solid state.

The discharge lamp 12 comprises means (not shown) for producing in the pressurized gas an electric arc for producing light. The means for producing the electric arc are supplied with electricity by an electrical supply device 16.

The supply device 16 comprises an electronic conversion module 18, which will be designated by the term "ballast" hereinafter according to the name normally used, which is supplied by a source of DC electric current 20 by means of a first electrical harness 22 supplying the ballast 18.

The source of DC electric current 20 is formed by a motor vehicle battery 20 that has a positive terminal and a negative terminal, designated respectively by the symbols "+" and "−" in FIG. 1.

The ballast 18 comprises more particularly first input connection means 26 in which a first reciprocal end connector 28, referred as the "input connector", of the supply harness 22 is engaged mechanically in an electrically connected position.

Figure 3:
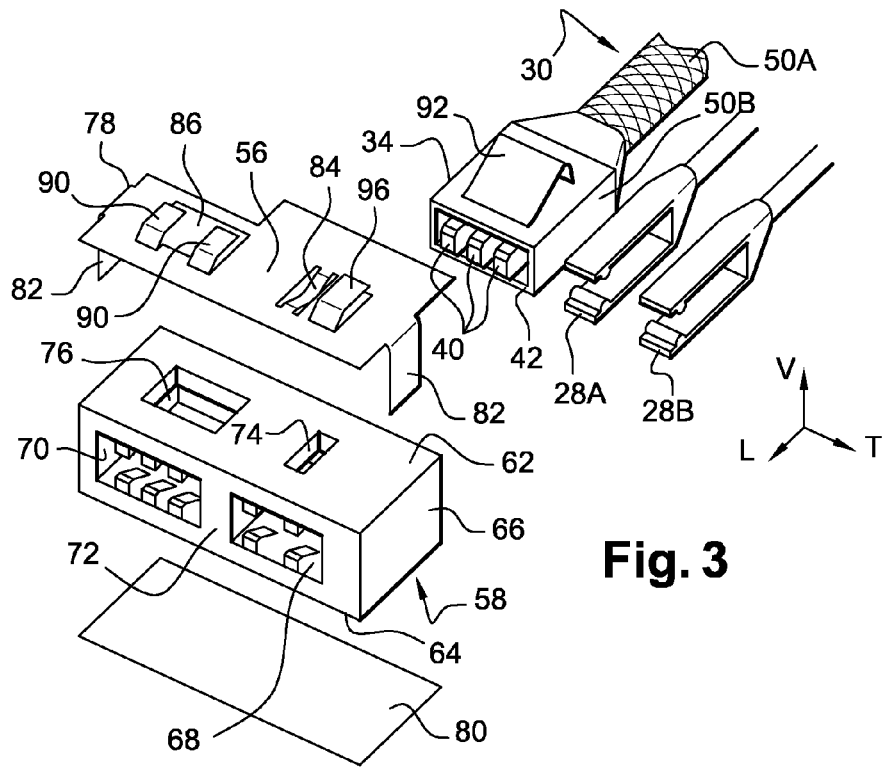
FIG. 3 is a view in exploded perspective that depicts a mechanical connection block of the electronic conversion module that is produced according to a first embodiment of the invention.

The supply harness 22 is formed by two insulated conductive wires 22A, 22B, which each have a first end electrically connected to an associated terminal of the battery 20 and a second end equipped with a plug in the form of a clamp forming the first reciprocal input connector 28, as shown in FIG. 3.

The first reciprocal input connector 28 thus comprises a first negative plug 28A electrically connected to the negative terminal and a second positive plug 28B electrically connected to the positive terminal.

The electronic conversion module 18 is intended to convert the DC electric current from the battery 20 into an AC electric current able to supply the discharge lamp 12 by means of a second electrical connection harness 30.

The supply device 16 is also equipped with a high-voltage starter module 24 interposed in the electrical circuit between the ballast 18 and the discharge lamp 12. In the example shown in FIG. 1, the discharge lamp 12 and the starter module 24 form a compact assembly.

The ballast 18 thus comprises an output electrical connector 32 in which a first reciprocal output connector 34 of the connection harness 30 is mechanically engaged in an electrically connected position.

The starter module 24 also comprises connection means 36 that are intended to be connected electrically with a second opposite end reciprocal connector 38 of the connection harness 30.

The connection harness 30 thus comprises a first output end connector 34 and a second starter end connector 38.

As illustrated in FIG. 3, the reciprocal output connector 34 comprises more particularly a plurality of plugs 40 with an appearance similar to those of the plugs 28A, 28B of the supply harness 22. The plugs 40 of the reciprocal output connector are electrically connected to each of the conductive wires constituting the connection harness 30. The plugs of the reciprocal output connector 34 are stored transversely in a hollow block support 42 of the reciprocal output connector 34, which is open at a front end face.

Figure 2:
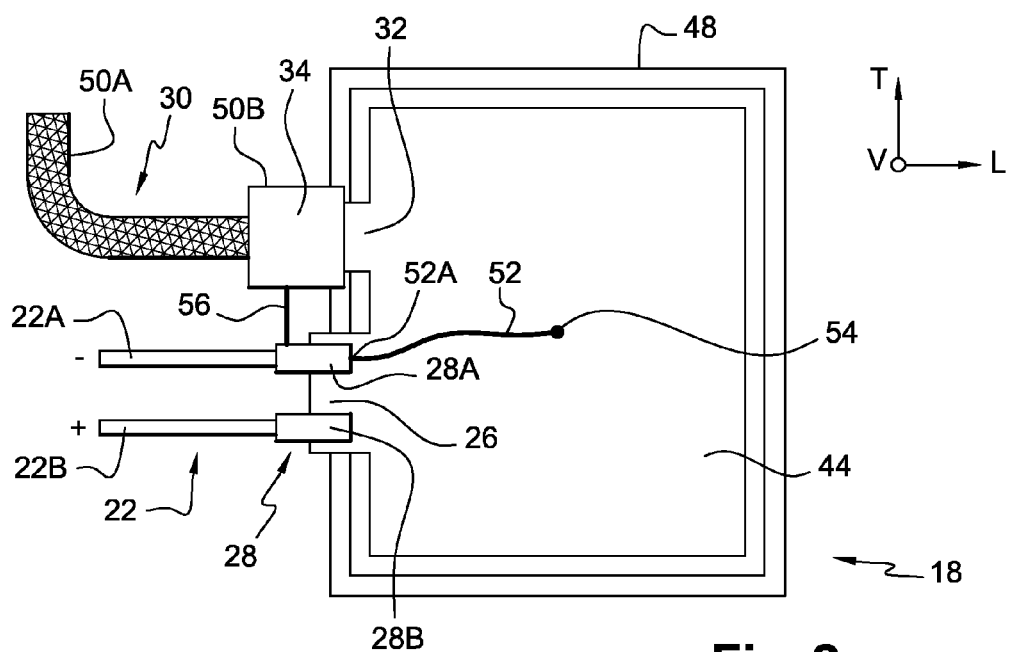
FIG. 2 is a schematic detail view that depicts an electronic conversion module or ballast of the supply device that is enclosed in a shielded housing and is connected to the battery on the one hand and to a shielded electrical harness on the other hand.

As is known and as shown in FIG. 2, the ballast 18 comprises a rectangular printed circuit card 44 that extends horizontally.

The first input 26 and output 32 connection means are arranged on a transverse rear end edge of the printed circuit card 44.

Thus the first input connection means 26 of the ballast 18 comprise an input portion of the rear transverse edge of the printed circuit card 44, on which there emerge two input track terminations intended to be electrically connected respectively to the negative plug 28A and to the positive plug 28B of the reciprocal input connector 28.

The second output connection means 32 also comprise an output portion of the rear transverse edge of the printed circuit card 44 on which there emerge output track terminations, each of which is intended to be electrically connected to an associated plug 40 of the reciprocal output connector 34.

Each reciprocal connector 28, 34 is thus intended to be arranged, by longitudinal sliding forwards, in its connected position in which each plug 28A, 18B, 40 is in electrical contact with the associated track termination.

In the example shown, the plugs 28A, 28B, 40 of the reciprocal connectors 28, 34 in their connected position are in the form of a clamp that is intended to straddle and elastically grip the edge of the printed circuit card 44.

When the headlight 10 is operating, the discharge lamp 12, the connection harness 30 and the ballast 18 emit electromagnetic radiation that is liable to stray and interfere with the functioning of other electrical equipment present in the motor vehicle.

In order to attenuate or even totally eliminate at least some frequencies of this parasitic electromagnetic radiation, it is known how to equip the supply device 16 with electromagnetic shielding produced from electrically conductive materials.

Thus the reflector 14 forms a first shielding that prevents the electromagnetic radiation emitted by the discharge lamp 12 from propagating to the inside of the vehicle.

The high-voltage starter module 24 is enclosed in a shielded case 46.

The ballast 18 is also enclosed in a shielded housing 48 impervious to impurities and liquids.

The connection harness 30 is surrounded by a shielded tubular envelope 50 that is here formed by a woven flexible tubular braid 50A of metal wires. At each of its two ends, the shielded envelope 50 comprises a jacket 50B of folded metal sheet that covers the top, bottom and side faces of the support of each output 34 and starter 38 end connector. The braid 50A is in electrical contact with the two end jackets 50B. Thus the shielded envelope 50 forms shielding for the connection harness 30 and its two reciprocal end connectors 34, 38.

The various shielding elements 14, 32, 34, 36 are all electrically connected to a common reference electrical potential that is here formed by the negative terminal "−" of the battery 20. More particularly, the housing 48 of the ballast 18 and the envelope 50 are electrically connected to the common reference electrical potential.

As is known and as shown in FIG. 2, the housing 48 is electrically connected to the negative terminal "−" of the battery 20 by means of a track 52 of the printed circuit card 44 of the ballast 18 that extends from the negative track 28A connected to the negative potential "−" of the battery 20 as far as a vertical contact stud 54 that is produced in one piece with the housing 48.

In a known manner, the reflector 14, the case 46, the envelope 50 and the housing 48 are electrically connected together in series in order to prevent local fluctuations in potential in the various shieldings.

In other words, the housing 48 being electrically connected to the negative terminal "−" of the battery 20, the envelope 50, the case 46 and the reflector 14 are also electrically connected series to the negative terminal "−".

However, when the ballast 18 is arranged in the motor vehicle, it is subject to numerous mechanical and thermal stresses. The housing 48 is therefore produced from a material that must be not only electrically conductive but also resistant to the mechanical and thermal stresses inherent in motor vehicle headlights. The choice of the strong material of the housing 48 is made to the detriment of its electrical conductivity. The housing 48 therefore has a not insignificant impedance which is liable to create electrical voltages in the various shielding elements connected in series.

According to the teachings of the invention, in order to improve the electromagnetic shielding performance, the housing 48 and the envelope 50 are connected in parallel to the negative terminal "−" forming the reference potential by means of an electrical contact element 56 as shown in FIG. 2.

The contact element 56 is produced from an electrically conductive material having better electrical conductivity than the material used for producing the housing 48. The contact element 56 is for example produced from a material containing copper, such as brass.

Advantageously, the contact element 56 is produced in a single piece so as to have an impedance as low as possible.

In a first embodiment of the invention shown in FIG. 2, the contact element 56 is arranged so as to electrically connect the negative plug 28A of the reciprocal input connector 28 with the jacket 50B that covers the reciprocal output connector 34 of the connection harness 30. The contact element 56 is then arranged outside the housing 48. The contact element 56 is for example formed by an electrically conductive wire.

Advantageously, the first input connection means 26 of the ballast 18 are arranged adjacent to the second output connection means 32 so that the travel of the electricity in the contact element 56 is a short as possible in order to reduce the impedance of the contact element 56 to the maximum possible extent.

According to a variant, not shown, of the invention, the contact element 56 connects an intermediate portion of the negative conductive wire 22A, or directly the negative terminal, with the flexible braid 50A of the envelope 50.

Figure 4:
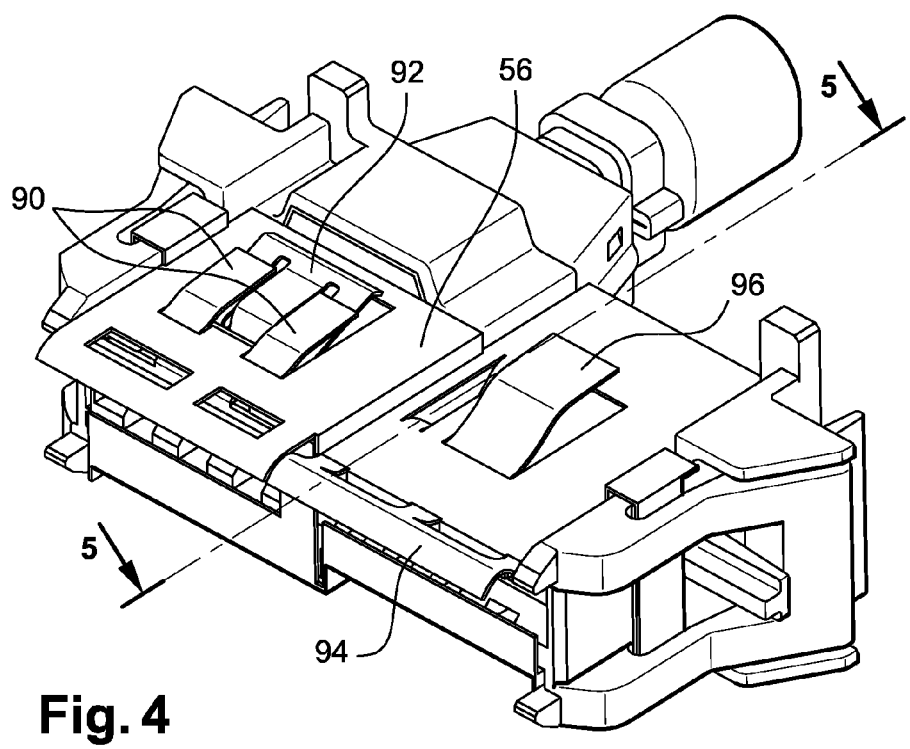
FIG. 4 is a view in perspective that depicts the mechanical connection block of FIG. 3 assembled.
Figure 5:
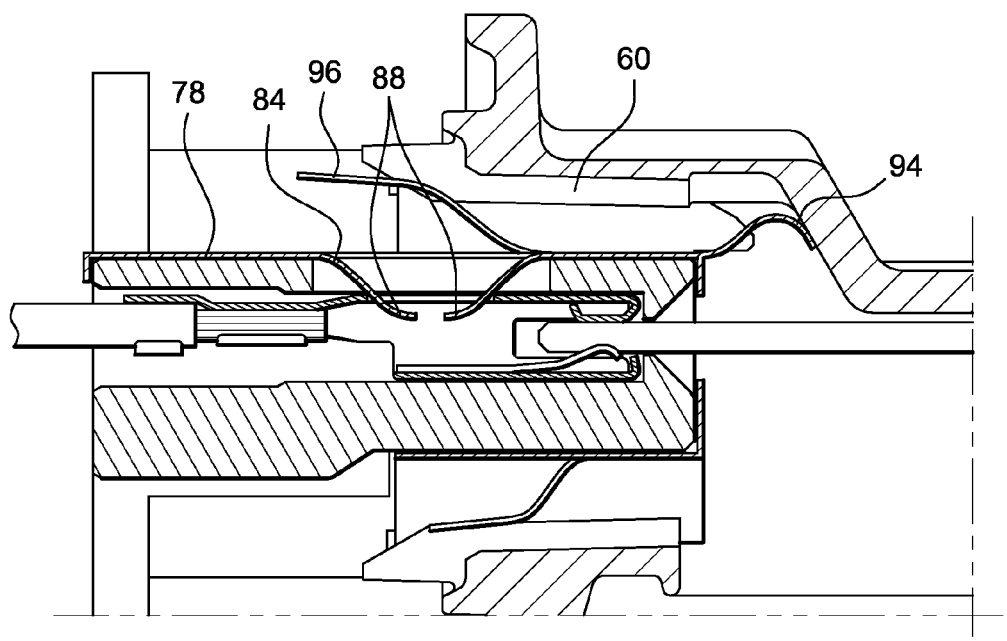
FIG. 5 is a view in longitudinal section along the cutting plane 5-5 in FIG. 4 that depicts contact blades of a Contact element with a contact area connected to the negative terminal of the battery of the motor vehicle.

According to a second embodiment of the invention depicted in FIGS. 3 to 5, the first and second connection means 26, 32 comprise a common mechanical connection block 58 intended to guide the reciprocal connectors 28, 34 as far as their connected position, and to participate in their mechanical holding in their connected position.

The connection block 58 is arranged in an opening 60 produced in a rear vertical transverse face of the housing 48, opposite the output and input portions of the rear edge of the printed circuit card 44.

The mechanical connection block 58 is in the form of a roughly right-angled parallelepipedal block defined vertically by a top horizontal face 62 and bottom horizontal face 64, and which is delimited transversely by two vertical lateral end faces 66.

The connection block 58 has a first input orifice 68 and a second output orifice 70 passing through it longitudinally, which make the inside of the housing 48 communicate with the outside.

The orifices 68, 70 are arranged adjacent transversely alongside each other. The orifices 68, 70 are separated from each other by a common longitudinal vertical partition 72.

The first input orifice 68 emerges inside the housing 48 on the input portion of the printed circuit card 44. The second output orifice 70 emerges inside the housing 48 on the output portion of the printed circuit card 44.

Each reciprocal input 28 and output 34 connector is thus intended to be inserted axially in the associated orifice 68, 70 and thus guided as far as its connected position as described previously.

The output orifice 70 has a profile complementary to the profile of the support 42 of the reciprocal output connector 34 of the connection harness 30. In the example shown in FIG. 3, the two orifices 68, 70 have a rectangular profile.

The reciprocal output connector 34 is thus maintained in its connected position transversely and vertically by the internal faces of the output orifice 70 with a complementary profile.

In this embodiment of the invention, the contact element 56 is carried by the connection block 58. The contact element 56 is more particularly arranged so as to electrically connect the common reference potential to the envelope 50 of the connection harness 30 when the reciprocal input connector 28 and the reciprocal output connector 34 simultaneously occupy their connected position.

The contact element 56 is formed by a link that straddles the common partition 72 from the outside.

For this purpose, the top face 62 of the connection block 58 is perforated by an input window 74 and an output window 76 that emerge respectively in the first input orifice 68 and in the second output orifice 70.

The first input window 74 emerges more particularly in line with the negative plug 28A in the connected position of the reciprocal input connector 28, as shown in FIG. 5.

In addition, in the embodiment depicted in the figures, the connection block 58 is equipped with shielding that is produced in one piece with the contact element 56.

Thus two top 78 and bottom 80 horizontal shells are intended to cover the external faces 62, 64, 66 of the connection block 58. For this purpose, the top 78 or respectively bottom 80 shell has a shape complementary to the shape of the top 62 or respectively bottom face 64 of the connection block 58.

The shells 78, 80 are produced from a sheet of electrically conductive material containing for example copper, such as brass.

At least one of the shells 78, 80 has two vertical lateral wings 82 that are intended to be pressed against the lateral faces 66 of the connection block 58 so that the two shells 78, 80 are in electrical contact with each other by means of the wings 82.

The material is also elastically deformable.

The top shell 78 also has two input 84 and output 86 openings coinciding with each of the input 74 and output 76 windows. The input 84 and output 86 openings are here formed by cropping the metal sheet.

The input opening 84 comprises a first cutout forming a front longitudinal input blade 88 that extends longitudinally towards the rear from a front end edge of the input opening 84 as far as a free end that is arranged substantially at the middle of the input opening 84.

The input opening 84 also comprises a second cutout forming a rear longitudinal input blade 88 that extends longitudinally towards the front from a rear end edge of the input opening 84 as far as a free end arranged substantially at the middle of the input opening 84.

The two input blades 88 are folded downwards, entering inside the input window 74 so as to be in electrical contact with a bared top face of the negative plug 28A of the reciprocal input connector 28 when the latter is in the connected position.

More particularly, the input blades 88 are elastically deformable so that, when the negative plug 28A is in the connected position, the free end of the input blades 88 bears elastically downwards against the negative plug 28A in order to provide permanent electrical contact.

The output opening 86 of the top shell 78 is equipped with two cutouts forming longitudinal contact output blades 90 that extend parallel towards the rear from a front end edge of the output opening 86 as far as a free end arranged in line with the output opening 86. The output blades 90 are intended to be in contact with a tongue 92 carried by the jacket 50B of the reciprocal output connector 34 when the latter is in the connected position.

The tongue 92 is produced from an electrically conductive material and is electrically connected to the jacket 50B. Advantageously, the tongue 92 is produced in one piece with the jacket 50B of the reciprocal output connector 34.

The tongue 92 extends vertically projecting upwards from the top face of the jacket 50B of the reciprocal output connector 34. The tongue 92 forms more particularly a ramp rising upwards from front to rear so as to deform the output blades 90 elastically in flexion upwards when it is inserted in the connected position. The output blades 90 are thus pressed elastically against the ramp in order to provide permanent electrical contact between the output blades 90 and the tongue 92 as long as the reciprocal output connector 34 is in its connected position.

Thus the contact element 56 is formed by the input blades 88, the output blades 90 and the top shell portion 78 that joins the input blades 88 and the output blades 90. The contact element 56 thus forms the link that straddles the common partition 72.

The two electrically interconnected shells 78, 80 also form the electromagnetic shielding so as to prevent leakages of electromagnetic radiation through the opening 60 in the housing 48. The shielding is produced in one piece with the contact element 56 and is connected to the reference potential by means of the input blades 88.

When the reciprocal input connector 28 is connected, the negative plug 28A is inserted longitudinally in the input orifice 68 of the input connection means 26 opposite the termination 52A of the associated track 52. During the insertion movement, the negative plug 28A comes into contact with the free end of the input blades 88, which it lifts elastically.

Thus, when the negative plug 28A occupies its connected position, the two input blades 88 are pressed downwards against the negative plug 28A through their elastic return force. The two shells 78, 80 and the housing 48 are thus in electrical contact with the negative terminal.

Then, when the reciprocal output connector 34 of the connection harness 30 is inserted longitudinally in the output orifice 70 of the connection block 58, the top tongue 92 comes into contact with the free end of the output blades 90. During the longitudinal insertion movement, the free end of the output blades 90 is lifted elastically upwards, sliding over the ramp of the tongue 92.

When the reciprocal output connector 34 is in the connected position, the output blades 90 are thus pressed downwards against the tongue 92 through their elastic return force so as to provide permanent electrical contact. The jacket 50B of the reciprocal output connector 34 and the envelope 50 are thus electrically connected to the negative terminal parallel to the housing 48.

According to a variant, not shown, of the invention, the contact element 56 is formed by a link that is produced as an independent piece. In this case, the connection block 58 may not have any shielding, or has independent shielding.

Advantageously, as depicted in FIGS. 4 and 5, the shells 78, 80 also have points of contact with the housing 48 so that the contact element 56 electrically connects the housing 48 to the reference potential parallel to the envelope 50. Increasing the contact points makes it possible to provide homogeneous electrical potential over the entire surface of the housing 48.

To this end, a front end portion of the top shell 78 is conformed as a convex channel 94 that runs transversely along the front end edge so as to form a contact line with an internal face of the housing 48.

In addition, the top shell 78 also comprises another contact blade 96 formed by a cropping of the shell 78, which is raised vertically upwards so as to form an additional point of contact with the housing 48.

According to a third embodiment of the invention depicted in FIG. 6, the housing 48 is equipped with a mechanical connection block 58 similar to that used for the second embodiment of the invention.

However, the contact element 56 passes directly through the common partition 72 to put the negative plug 28A in contact with the jacket 50B of the reciprocal output connector 34. For this purpose, the common partition 72 has a window 98 in it.

The negative plug 28A is advantageously arranged so as to be interposed transversely between the common partition 72 and the positive plug 28B.

The contact element 56 is carried by the second reciprocal output connector 34. More particularly, the contact element 56 is formed by a blade that extends transversely projecting with respect to the lateral face of the jacket 50B of the reciprocal output connector 34 that is turned towards the common partition 72.

The contact element 56 also has a free end. The contact element 56 is elastically deformable in flexion when the reciprocal output connector 34 is introduced into the corresponding output orifice 70.

In order to allow the insertion and removal of the reciprocal output connector 34, the contact element 56 has the form of a horizontal V, the point 100 of which is oriented transversely towards the common partition 72. The first branch 56A is for example mechanically connected to the jacket 50B by its end opposite to the point 100, while the end of the other branch 56B forms the free end of the contact element 56.

When the output connector 34 is inserted in the connection block 58, the first branch 56A comes into contact with the rear end edge of the common partition 72. Then the longitudinal insertion movement of the output connector 34 continues so that the contact element 56 is elastically flexed transversely towards the output connector 34 until the point 100 of the V is in contact with the internal face of the common partition 72. The point 100 of the contact element 56 is then pressed transversely against the internal wall of the common partition 72 by its elastic return force.

When the output connector 34 is in the connected position, the point 100 of the contact element 56 is opposite the window 98 inside which it is elastically returned transversely so that the point 100 is in abutment on the negative plug 28A of the input connector 28 in the connected position.

According to a variant, not shown, of the invention, the contact element 56 is carried symmetrically by the negative plug 28A of the input connector 28.

According to yet another variant, not shown, of the invention, the contact element 56 is produced in an independent piece that is fixed in the window 98 of the common partition 72 so as to be in contact firstly with the jacket 50B and secondly with the negative plug 28A when the reciprocal input 28 and output 34 connectors are simultaneously in their connected position.

For this purpose, the two transverse ends of the contact element 56 comprise transverse end blades elastically deformable transversely so as to allow the insertion of the negative plug 28A and the output connector 34, and so as to ensure that the end blades are permanently maintained in electrical contact with the reciprocal connectors 28, 34 in the connected position through their elastic return force.

According to a fourth embodiment of the invention depicted in FIG. 7, the negative track 52 of the first connection means 26 comprises a double termination in the form of a fork that is arranged on the input portion of the card 44.

It thus comprises the first termination 52A on which the negative plug 28A is intended to be connected, and a second diverted termination 52B that extends parallel to the first termination 52A. The second diverted termination 52B is interposed transversely between the first termination 52A and the common partition 72. The terminations 52A, 52B are thus electrically connected to each other.

In this embodiment, the contact element 56 is formed by a rigid link that straddles a vertical rear longitudinal end edge 102 of the common partition 72.

The contact element 56 comprises more particularly a rigid arm 104, a first portion 104A of which extends transversely from the jacket 50B of the output connector 34 at the rear of the rear end edge 102 of the common partition 72 when the output connector 34 is in the connected position. The rigid arm 104 is mechanically connected to the jacket 50B by a rigid connection.

A free end portion 104B of the arm 104 extends longitudinally forwards inside the first input orifice 68 of the block 58, forming an elbow, for example at a right angle, with the first portion 104A.

The contact element 56 is thus formed by the arm 104 in the form of an L that is sized so as to straddle from the rear the rear end edge 102 of the common partition 72 of the block 58.

The front free end of the second portion 104B is conformed as a clamp identical to the negative plug 28A.

Thus, when the output connector 34 is in the connected position, the contact element 56 straddles the rear end edge 102 of the common partition 72 so that the second portion 104B of the arm 104 grips the diverted termination 52B of the negative track 52 of the card 44. The jacket 50B of the output connector 34 is thus in electrical contact with the diverted termination 52B of the negative track 52 by means of the contact element 56.

When the negative plug 28A is in its connected position, the negative potential is routed through the first termination 52A as far as the junction with the second termination 52B, and then through the second diverted termination 52B as far as the contact element 56, which is itself in electrical contact with the jacket 50B of the output connector 34.

Advantageously, the common partition 72 is longitudinally shorter than the block 58 so that the rear end edge 102 of the common partition 72 is arranged inside the block 58. Thus, when the output connector 34 is in the connected position, the contact element 56 is arranged entirely inside the block 58. The contact element 56 is thus protected from any mechanical shocks.

Naturally the invention is not limited to the implementation of only one of the embodiments described above. Thus the various embodiments may be combined so that the shielding envelope is connected to the negative terminal at a number of points.

The invention also applies to connection means produced in other forms. Thus the invention also applies to a mechanical connection block comprising electrical contact plugs that are intended to be electrically connected on the one hand with the associated plugs of the reciprocal connectors and on the other hand with the associated track of the printed circuit card.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. An electrical supply device for a discharge lamp of a motor vehicle headlight that comprises:
   an electronic module for converting source electric current into supply electric current for the discharge lamp;

a housing that encloses said electronic module that comprises an electrically conductive material so as to form electromagnetic shielding;

an electrical connection harness that is intended to electrically connect said electronic module with the discharge lamp;

a shielding envelope comprising an electrically conductive material that surrounds said electrical connection harness so as to form electromagnetic shielding;

said housing and said shielding envelope being electrically connected to a common reference electrical potential (−);

wherein said housing and said shielding envelope are connected in parallel to said common reference electrical potential (−);

wherein said housing further comprises:

first connection means in which a first reciprocal connector electrically connected to said common reference electrical potential (−) is intended to be engaged mechanically in a first connected position;

second connection means in which a second reciprocal connector of said electrical connection harness is intended to be engaged mechanically in a second connected position, said second reciprocal connector being surrounded by said shielding envelope of said electrical connection harness;

said first connection means being arranged adjacent to said second connection means; and a contact element is arranged so as to electrically connect said common reference electrical potential (−) to said shielding envelope when said first and second reciprocal connectors simultaneously are in their said first and second connected positions, respectively.

2. The electrical supply device according to claim 1, wherein said shielding envelope is connected to said common reference electrical potential (−) by means of a contact element made of an electrically conductive material having better electrical conductivity than the material used for producing said housing.

3. The electrical supply device according to claim 2, wherein said contact element is produced from a material containing copper.

4. The electrical supply device according to claim 1, wherein said first and second connection means comprise a common mechanical connection block arranged in an opening in said housing, and in that said contact element is carried by said common mechanical connection block.

5. The electrical supply device according to claim 4, wherein said common mechanical connection block comprises a common partition that separates said first connection means from said second connection means, and in that said contact element is formed by a link that straddles said common partition.

6. The electrical supply device according to claim 5, wherein said common mechanical connection block is surrounded by electromagnetic shielding produced in one piece with said contact element so as to prevent leakages of electromagnetic radiation through an opening in said housing.

7. The electrical supply device according to claim 5, wherein said first connection means comprise an electrical connection with at least two connection branches of said electronic module, electrically connected to each other, said first reciprocal connector electrically connected to said common reference electrical potential (−) being intended to come to be engaged mechanically in a position connected to one of the these branches and said contact element being intended to engage mechanically and in electrical contact with the other connection branch.

8. The electrical supply device according to claim 7, wherein said electrical connection is an electrical track of a printed circuit card of said electronic module and is in the form of a fork, each branch of said fork constituting a connection branch of said electronic module.

9. The electrical supply device according to claim 1, wherein said first and second connection means comprise a common mechanical connection block arranged in an opening in said housing, said common mechanical connection block comprising a common partition that separates said first connection means from said second connection means, and in that said contact element passes through said common partition.

10. The electrical supply device according to claim 9, wherein said contact element is carried by one of said first or said second reciprocal connectors.

11. An electrical supply device for a discharge lamp of a motor vehicle headlight that comprises:

an electronic module for converting source electric current into supply electric current for the discharge lamp;

a housing that encloses said electronic module that comprises an electrically conductive material so as to form electromagnetic shielding;

an electrical connection harness that is intended to electrically connect said electronic module with the discharge lamp;

a shielding envelope comprising an electrically conductive material that surrounds said electrical connection harness so as to form electromagnetic shielding;

said housing and said shielding envelope being electrically connected to a common reference electrical potential (−);

wherein said housing and said shielding envelope are connected in parallel to said common reference electrical potential (−);

wherein said shielding envelope is connected to said common reference electrical potential (−) by means of a contact element made of an electrically conductive material having better electrical conductivity than the material used for producing said housing;

wherein said contact element is produced from a material containing copper;

wherein said housing comprises:

a first reciprocal connector electrically connected to a said common reference electrical potential (−) is intended to be engaged mechanically in a connected position;

a second reciprocal connector of a connection harness is intended to be engaged mechanically in a connected position, said second reciprocal connector being surrounded by said shielding envelope of said connection harness;

the first reciprocal connector being arranged adjacent to said second reciprocal connector; and a contact element is arranged so as to electrically connect said common reference electrical potential (−) to said shielding envelope when said first and second reciprocal connectors simultaneously are in their connected position.

12. An electrical supply device for a discharge lamp of a motor vehicle headlight comprising:

a ballast, said ballast having an electrically conductive housing;

an electrical conductive harness coupling said ballast to the discharge lamp, said electrical conductive harness comprising an electrically conductive envelope surrounding said electrical conductive harness; and said electrically conductive envelope and said electrically conductive housing being connected in parallel to a common reference electrical potential;

a first reciprocal connector electrically connected to said common reference electrical potential is intended to be engaged mechanically in a connected position;

a second reciprocal connector of a connection harness is intended to be engaged mechanically in a connected position, said second reciprocal connector being surrounded by said electrically conductive envelope of said connection harness;

the first reciprocal connector being arranged adjacent to said second reciprocal connector; and a contact element is arranged so as to electrically connect said common reference electrical potential to said electrically conductive envelope when said first and second reciprocal connectors simultaneously are in their connected position.

13. The electrical supply device of claim 12 wherein said electrically conductive envelope and said electrically conductive housing being connected in parallel to said common reference electrical potential using a material having an electrical conductivity that is greater than an electrical conductivity of said electrically conductive housing.

14. The electrical supply device of claim 13 wherein said material comprises copper.

* * * * *